United States Patent [19]

Patchen

[11] Patent Number: 4,862,482
[45] Date of Patent: Aug. 29, 1989

[54] RECEIVER FOR MANCHESTER ENCODED DATA

[75] Inventor: Paul J. Patchen, Arlington, Tex.

[73] Assignee: National Semiconductor Corporation, Santa Clara, Calif.

[21] Appl. No.: 207,772

[22] Filed: Jun. 16, 1988

[51] Int. Cl.$^4$ .............................................. H03M 5/12
[52] U.S. Cl. ...................................... 375/87; 375/110
[58] Field of Search ...................... 375/82, 83, 87, 106, 375/110; 328/118, 151; 307/352, 353; 360/42

[56] References Cited

U.S. PATENT DOCUMENTS

| | | | |
|---|---|---|---|
| 3,836,956 | 9/1974 | Cross | 371/57 |
| 3,859,631 | 1/1975 | Holmes et al. | 375/87 |
| 3,938,082 | 2/1976 | Schowe, Jr. | 371/47 |
| 3,942,037 | 3/1976 | Mensch, Jr. | 307/232 |
| 4,181,919 | 1/1980 | Phillips, Jr. | 360/42 |
| 4,531,223 | 7/1985 | Ashida | 375/110 |
| 4,567,604 | 1/1986 | Jacksier | 375/87 |
| 4,583,008 | 4/1986 | Grugett | 307/265 |
| 4,592,072 | 5/1986 | Stewart | 375/55 |
| 4,606,052 | 8/1986 | Hirzel et al. | 375/87 |
| 4,608,702 | 8/1986 | Hirzel et al. | 375/110 |
| 4,688,232 | 8/1987 | Fox | 375/87 |
| 4,763,338 | 9/1988 | Barndt, Sr. | 375/87 |

Primary Examiner—Benedict V. Safourek
Attorney, Agent, or Firm—Limbach, Limbach & Sutton

[57] ABSTRACT

A receiver for extracting binary data from a Manchester-encoded input signal. Sampling logic samples the input signal at a frequency greater than the bit cell rate to detect input edges. The sampling logic output is divided to provide a sampling clock having a frequency greater than the bit cell rate and which is synchronized with the input signal. The sampling clock is then utilized to sample the first bit cell half of the sampled input signal. The value obtained by sampling the first bit cell half is then inverted to provide extracted binary data.

5 Claims, 4 Drawing Sheets

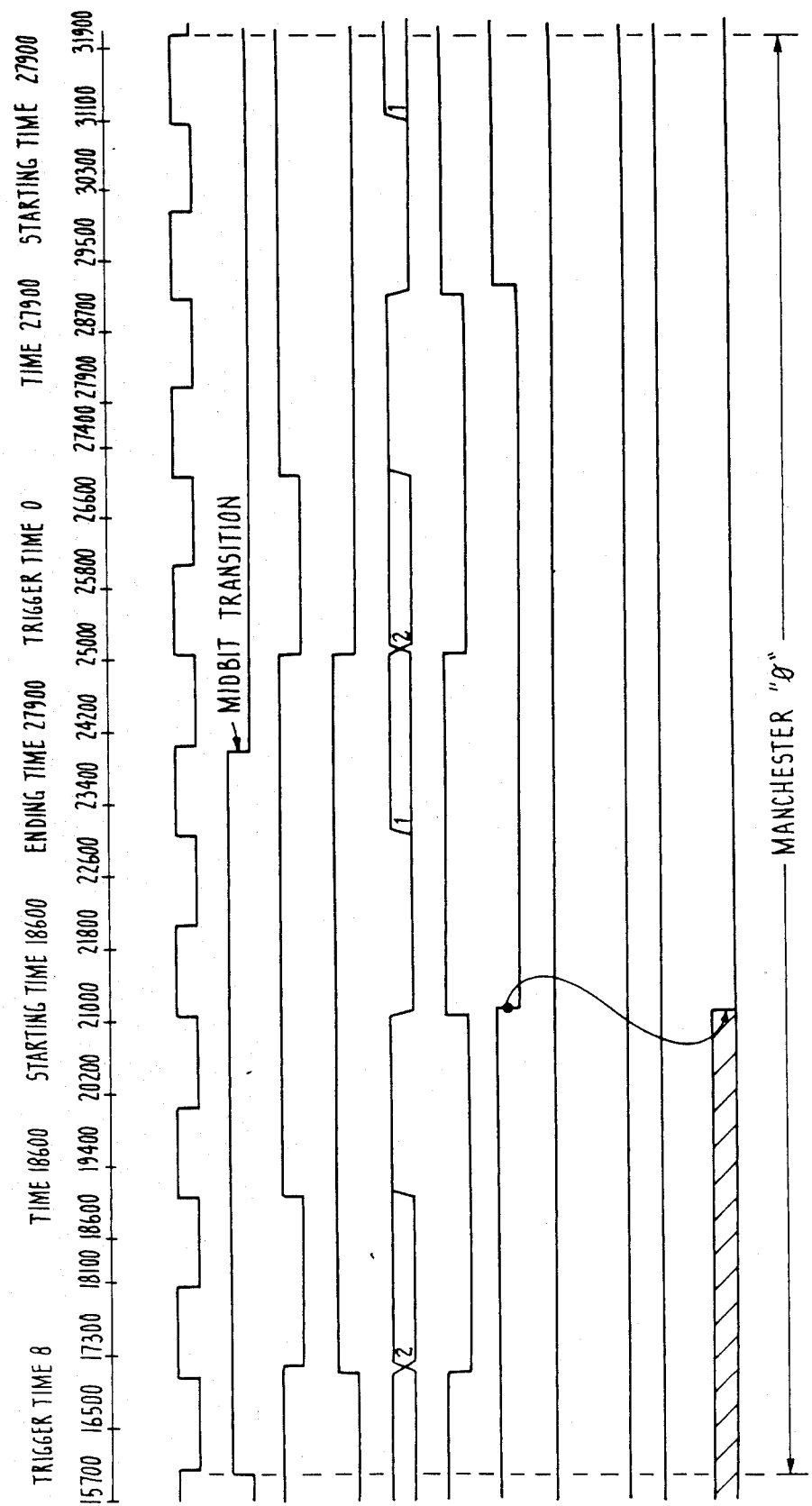

RECEIVER FOR MANCHESTER ENCODED DATA

BACKGROUND OF THE INVENTION

1. Field of the Invention

The present invention relates to data transmission systems and, in particular, to circuitry for recovering a clock and binary data from a Manchester-encoded input using digital sampling.

2. Discussion of the Prior Art

Manchester encoding is a very popular means for transmitting a serial data stream for reception without including a separate clock signal. The clock is included with the data since, in accordance with Manchester encoding format, each bit cell must have a level transition in the middle of the bit cell (this transition will henceforth be referred to as a "midbit" transition). The midbit transition allows the receiver to remain synchronized to the incoming data by extracting a clock synchronized to the incoming data.

To maintain accurate decoding of received data, the noise on the transmission media must be distinguished from real data; this must be done in a manner such that data is not lost. To synchronize to a received frame, a unique pattern is sent to allow the receiver to properly align itself to the frame and to extract the binary data encoded in the pattern. The input to the receiver circuit must be a digital signal. Since the Manchester-encoded data is typically transmitted in a differential manner, a comparator typically precedes the receiver logic to perform this conversion.

Once the receiver logic is aligned to the incoming data, it extracts the binary data from the Manchester-encoded input by sampling the data at the appropriate point in time. As stated above, the sampling point is determined by generating a clock derived from the incoming data. Finally, upon reaching the end of a transmission, a unique pattern is typically sent to tell the receiver logic that the frame is ending and to wait for another starting pattern before extracting any more data.

One type of known receiver, the National Semiconductor Corporation DP8341 Serial Bi-Phase Receiver/Decoder, samples Manchester-encoded data at a frequency which is eight times greater than the data bit cell rate. The NSC DP8341 also provides a two bit divider for recovering the synchronized data sampling clock. The data sampling clock is then utilized to extract the binary data from the sampled data by sampling each half bit time of the sampled data bit cells.

SUMMARY OF THE INVENTION

A receiver for recovering Manchester encoded data in accordance with a preferred embodiment of the present invention samples the incoming data at eight times the maximum frequency of the data. To obtain synchronization, a two bit shift register is used to detect edges in the incoming data pattern. When the Q outputs of the two flip flops in the shift register differ, an edge has been detected and the receiver takes action based on this event. To lock in phase with the incoming message, the receiver must see a defined starting sequence pattern. The pattern is compared in another shift register that contains each half bit time value in the starting sequence. Once the starting sequence is decoded, the receiver is locked onto the message and continues to clock in data values every half bit time to ensure that midbit transitions occur.

The receiver receives Manchester encoded data and extracts both the binary pattern and the necessary timing information from the data to sample the data properly. This task is achieved by first synchronizing to edges in the data stream with the approach discussed above. Once an edge is detected, a counter is preset on the next rising edge of the receiver 8X clock. The counter provides the necessary clocks for sampling the data and is resynchronized with each detected edge in the data. The complement of the divide-by-four bit of the counter becomes the clock to sample the half bit time of the Manchester encoded data. The value of each half bit time is shifted into a decoder to determine when a valid starting sequence has been received. After receiving a start sequence, the binary data is extracted from the Manchester encoded data by loading the complement of the sampled first half bit time into a shift register clocked at the data rate. The data rate clock is simply a further divide by two of the half bit time clock discussed above.

Other advantages and features of the present invention will be better understood and appreciated by reference to the detailed description of the invention provided below which should be considered in conjunction with the accompanying drawings.

BRIEF DESCRIPTION OF THE INVENTION

FIGS. 2A–2C are timing diagrams illustrating the decoding of an incoming Manchester-encoded input to extract binary data in accordance with the present invention.

DETAILED DESCRIPTION OF THE INVENTION

Figure 1:
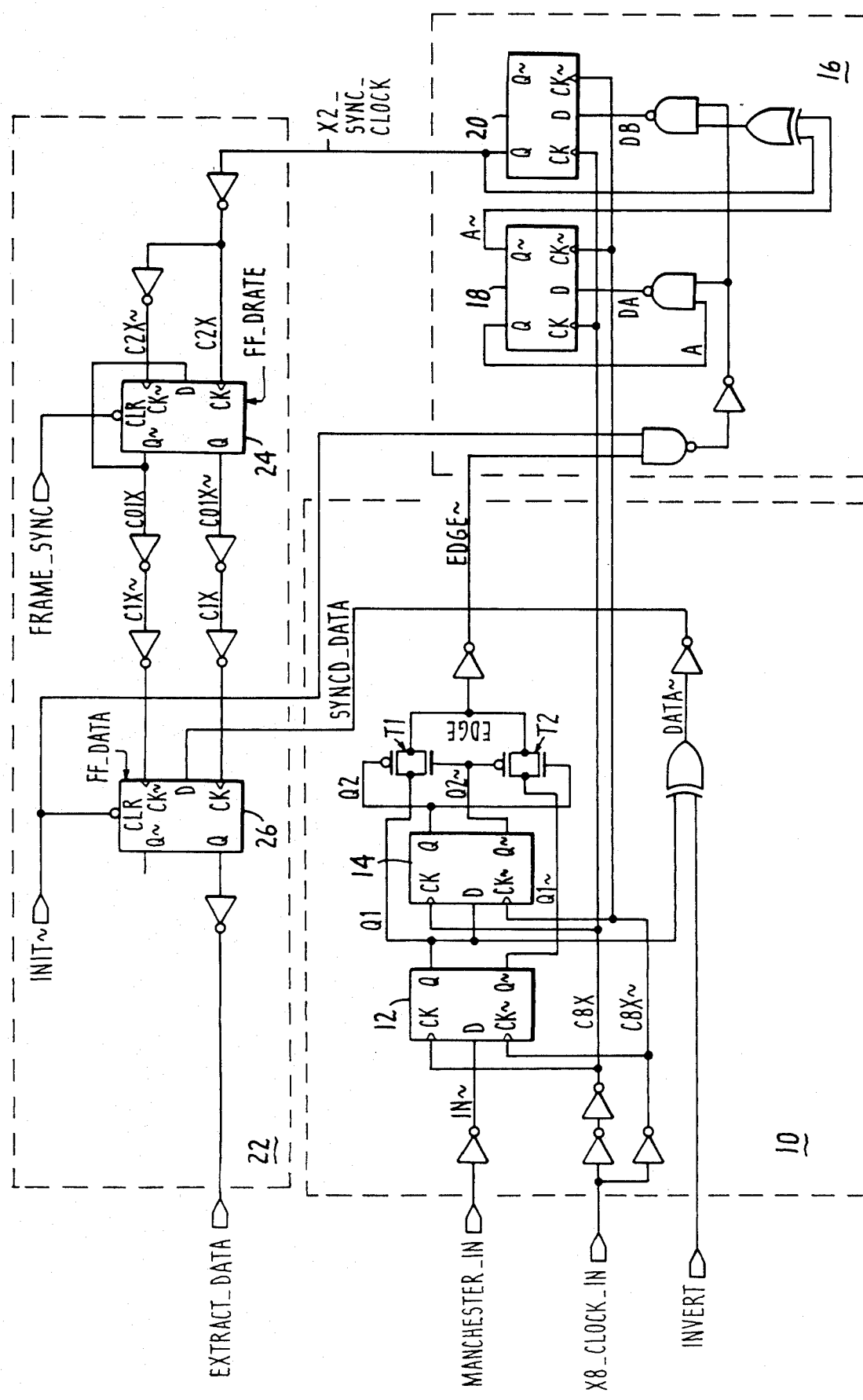
FIG. 1 is a block diagram illustrating a receiver in accordance with the present invention with logical grouping as to the function of each sub-block.

To extract binary data from a Manchester-encoded input, the data must first be sampled in order to synchronize the edges detected in the received bit stream. As shown in FIG. 1, a receiver circuit in accordance with the present invention accomplishes this utilizing sampling logic 10.

The sampling logic 10 uses a two-bit shift register, comprising flip-flops 12 and 14, to detect transitions in the incoming Manchester encoded data MANCHESTER_IN. The two D-type flip-flops 12 and 14 are clocked with the same clock X8_CLOCK_IN the frequency of which is eight times the frequency of the incoming data MANCHESTER_IN. By connecting the Q output of the first flip-flop 12 to the data input D of the second flip-flop 14, a 2-bit shift register is formed. That is, each rising edge of the clock X8_CLOCK_IN places new data in the first flip-flop 12 while the prior sampled data is clocked into the second flip-flop 14. The outputs Q1, Q1' and Q2, Q2' of flip-flops 12 and 14, respectively, are then exclusive-ored through gates T1 and T2 to create a signal EDGE that pulses when the Q outputs of the two flip-flops differ, i.e., upon detection of a midbit transition of the incoming data MANCHESTER_IN.

As shown in FIG. 1, the INVERT input allows true or inverted reception of the incoming data. The outputs of the sampling logic 10 are EDGE' and SYNC_DATA. The SYNC_DATA signal is simply the sampled data output that is created from sampling the input waveform MANCHESTER_IN at the eight times clock rate. As stated above, the EDGE' signal goes low when internal signals Q1 and Q2 are of opposite polarity.

The sampling logic 10 may be characterized as a digital phase lock since the sampled data is locked onto by sampling at some higher rate than the data rate and by synchronizing to transitions detected at the higher rate. Of key importance to clean operation is that the two sampling flip-flops 12 and 14 must be immune to metastability problems. Using CMOS flip-flops with high speed feedback paths and deskewed clocks reduces the probability of such metastability problems.

To generate clocks to form the correct extracted data output EXTRACT_DATA, a two bit divider 16 is used.

The divider 16 is, essentially, a 2-bit counter that is used to divide down the input clock rate. The divider 16 is synchronous since both D-type flip-flops 18 and 20 are clocked with the same clock, i.e., X8_CLOCK_IN. The first state 18 of the divider divides the 8X clock rate by two, forming the signal A with a frequency of 8X/2=4X. The second stage 20 further divides down the frequency, forming the signal X2_SYNC_CLOCK with a resulting frequency of 8X4=2X, or twice the frequency of the data rate.

The signal EDGE from sampling logic 10 alters the state of the divider 16, thus synchronizing the output X2_SYNC_CLOCK of the divider 16 to edges detected at the input. When EDGE goes high, the next rising edge of the 8X clock causes the divider 16 to be preset to a value of B11 (therefore, synchronously preset). The next rising edge of the 8X clock causes the count to go to B00, resulting in a rising edge of X2_SYNC_CLOCK which is aligned with the center of the MANCHESTER_IN half bit time.

As stated above, the X2_SYNC_CLOCK signal is the divide-by-four output of the divider 16, thus making its rate twice the rate of the incoming Manchester-encoded data.

As shown in FIG. 1, the output SYNC_DATA of the sampling logic 10 and the output X2_SYNC_CLOCK of the divider 16 are provided to decoding logic 22. As discussed in detail below, in accordance with the present invention, the decoding logic 22 samples the first half of the Manchester bit cell and inverts the value to form the data output EXTRACT_DATA.

By using the EDGE signal to synchronize the divider 16, C2X will go high in the middle of each half bit time and allow sampling of each half of the bit cells. Sampling each half of the bit cell allows the starting and ending pattern to be decoded as discussed earlier for aligning the receiver logic correctly to the data. The correct alignment is accomplished with the FRAME_SYNC signal. FRAME_SYNC will only go high when C2X goes high and the correct starting pattern is decoded. This can be accomplished with a simple shift register and decoder that triggers FRAME_SYNC when the starting pattern is shifted in and the logic is correctly aligned.

Since C2X rises in the middle of each half bit time, it must be further divided by two to sample the appropriate half bit cell and create the EXTRACT_DATA output. Flip-flop 24 is used to divide down C2X and generate CIX to sample SYNC_DATA and form EXTRACT_DATA. FRAME_SYNC goes high during the second half bit time of the cell, allowing CIX to go low on the next rising edge of C2X, which will occur in the first half bit time of the next bit cell. With this constraint and the fact that there will always be a midbit transition in the Manchester-encoded data, the EXTRACT_DATA output is formed by sampling the first half bit time of the cell and inverting it to form the correct extracted data from the Manchester-encoded input.

Thus, a key difference between the receiver disclosed herein and previously-known receivers is the time at which the binary data is extracted from the incoming Manchester encoded data. Referring to FIG. 1, as stated above, the binary extracted data is the signal EXTRACT_DATA which is formed by sampling SYNC-DATA with a clock formed from the incoming data. As discussed above, C2X rises roughly in the middle of each half bit time allowing the data to be sampled at both the first half of the bit time and at the last half. As stated above, previously known receivers extract the data during the last half of the bit time. The receiver of the present invention uses the inherent constraint of Manchester encoded data that the first half and the last half of the bit time must be complementary. By sampling the first half of the bit time and inverting the value, the present receiver makes the extracted data available one half bit time earlier than prior receivers. This early extraction of data is beneficial since there is usually a constraint on the amount of time available for processing and taking action based on the data received.

Figure 2A:
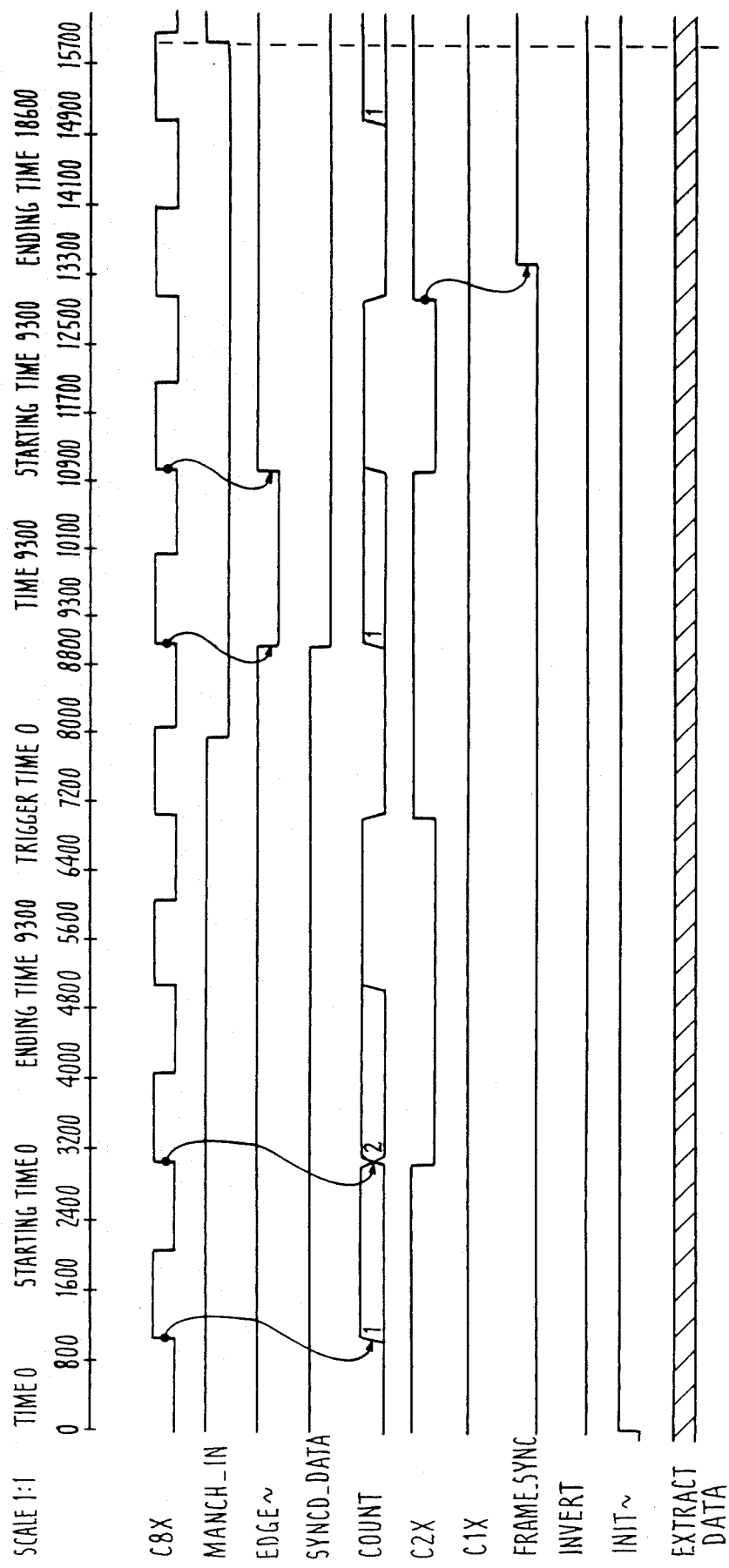

FIG. 2B illustrates when the binary data is extracted from the incoming Manchester bit cell. The signal EXTRACT_DATA becomes valid a propagation delay after the falling edge of CIX, which occurs in the middle of the first half of the bit time. EXTRACT_DATA goes low in anticipation of the required midbit transition, thus yielding knowledge of the data prior to actually sampling the second part of the bit cell.

The signal INIT' is used simply to initialize the divider 16 and flip-flop 26 for holding the EXTRACT_DATA value. At this point, the EXTRACT_DATA output is deserialized via a shift register and as complete frames are received, the parallel data is passed for processing.

As stated above, the receiver logic requires that the incoming Manchester-encoded data be at a frequency that is one eighth that of the X8_CLOCK_IN input. This works well since the transmission is crystal controlled, thus allowing a high degree of accuracy in maintaining this constraint.

The logic described above allows for fluctuations in the incoming Manchester-encoded data of up to one period of the X8_CLOCK_IN clock input. This means that, in the case where the next edge should occur four periods of X8_CLOCK_IN later, the logic can tolerate the edge occurring as early as three X8_CLOCK_IN periods or as late as five X8_CLOCK_IN periods. Similarly, when the next edge should occur eight periods of X8_CLOCK_IN later, the logic can tolerate the edge occurring as early as seven X8_CLOCK_IN periods or as late as nine X8_CLOCK_IN periods. This tolerance allows adequate pad in the receiver design for very low error rates in a working environment.

Figure 2C:
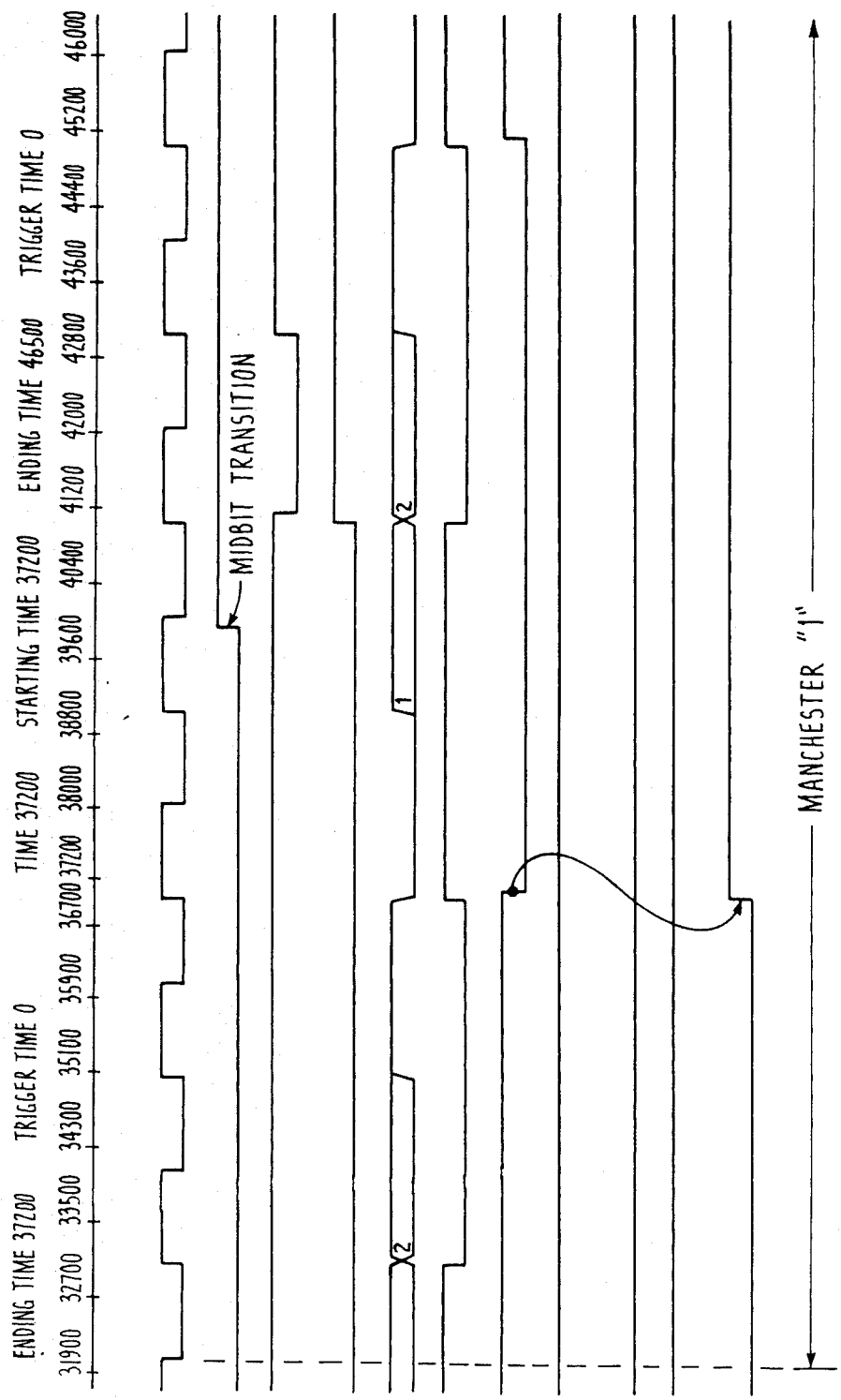

FIG. 2 shows the timing relationship between the key signals shown in FIG. 1. For sake of clarity, a Manchester one is defined as a half bit time of zero followed by a half bit time of one. The MANCHESTER_IN input is two Manchester zeroes followed by a Manchester one. FRAME_SYNC goes high on the rising edge of C2X, corresponding to the second half bit time of the first Manchester zero, as described above. This signal is created by logic that detects a starting pattern preceding the data frame. The rising edge of C2X during the second half of the first Manchester zero triggers FRAME_SYNC to go high which allows the decoding to start in the next bit time, At the beginning of the next bit frame, MANCHESTER_IN goes high since the bit is a Manchester zero and EDGE' falls on the next rising edge of X8_CLOCK_IN after the transition. On the next edge of X8_CLOCK_IN, the COUNT but goes to 11 as the divider is preset. The COUNT bus is the octal count of X2_SYNC_CLOCK and A with X2_SYNC_CLOCK being the most significant bit. Continuing on, the next rising edge of X8_CLOCK_IN causes COUNT to roll over to 0 and hence C2X rises. Note that this rising edge of C2X aligns closely to the center of the corresponding half bit time on SYNC_DATA. As C2X rises, flip-flop 24 toggles, causing C1X to fall, which samples SYNC_DATA to yield the binary datum sent in the corresponding bit frame. Also note that, as stated above, the data is inverted prior to becoming EXTRACT_DATA since the data sampled at this point is the first part of the bit cell. Therefore, the data is correct for the bit cell. When the midbit transition is detected, the same process occurs with EDGE' and COUNT occur so that the logic remains synchronized to the incoming Manchester encoded data for the next bit cell.

It should be understood that the invention is not intended to be limited by the specifics of the above-described embodiment, but rather defined by the accompanying claims.

What is claimed is:

1. A receiver for extracting binary data from a Manchester-encoded input signal having a predetermined bit cell rate utilizing an input sampling clock having a frequency that is an integer multiple of the bit cell rate of the input signal, the receiver comprising:
   (a) means for generating a pulsed signal that pulses in correspondence to midbit transitions of the input signal, comprising:
      (i) a first D-type flip-flop that receives the input signal as its data input and is clocked by the input sampling clock;
      (ii) a second D-type flip-flop that receives the output of the first flip-flop as its data input and is clocked by the input sampling clock such that each rising edge of the input sampling clock places new data in the first flip-flop while the prior data of the first-flop is placed in the second flip-flop; add
      (iii) means responsive to the outputs of the first and second flip-flops for generating the pulsed signal when the logic state of the output of the first flip-flop differs from the logic state of the output of the second flip-flop;
   (b) means for sampling the input signal at the frequency of the input sampling clock to provide a synchronized data signal having a first bit cell half and a second bit cell half;
   (c) means for recovering a data sampling clock from the pulsed signal;
   (d) means for sampling the first bit cell half of the synchronized data signal to provide an output data signal having the logic state of the first bit cell half; and
   (e) means responsive to the output data signal for providing an extracted binary data signal.

2. A receiver as in claim 1 wherein the input sampling clock has a frequency of eight times the bit cell rate of the input signal.

3. A receiver as in claim 1 wherein the means for providing an extracted binary data signal comprises means for inverting the output data signal to provide the extracted binary data signal.

4. A receiver as in claim 1 wherein the divider comprises a 2-bit counter for providing a data sampling clock having a frequency which twice the frequency of the bit cell rate of the input signal.

5. A receiver as in claim 4 wherein the divider comprises
   (a) a first D-type flip-flop for generating a clock signal having a frequency of one-half that of the data sampling clock; and
   (b) a second D-type flip-flop responsive to the clock signal for generating the data sampling clock.

* * * * *